US005400412A

United States Patent [19]

King, Sr. et al.

[11] Patent Number: 5,400,412

[45] Date of Patent: Mar. 21, 1995

[54] PANEL MOUNT SPEAKER SUPPORT SYSTEM

[75] Inventors: Jeffrey W. King, Sr., La Jolla; Jeremy P. Burkhardt; Edward H. Haase, both of Riverside, all of Calif.

[73] Assignee: Speakercraft, Inc., Riverside, Calif.

[21] Appl. No.: 192,998

[22] Filed: Feb. 8, 1994

[51] Int. Cl.[6] ......................... H04R 25/00; H05K 5/00

[52] U.S. Cl. .................................... 381/188; 381/152; 381/205; 181/150

[58] Field of Search ........................ 181/150, 171, 172; 381/188, 205, 152

[56] References Cited

U.S. PATENT DOCUMENTS 3,859,480 1/1975 Brikner ................................ 181/171

*Primary Examiner*—Forester W. Isen
*Assistant Examiner*—Sinh Tran
*Attorney, Agent, or Firm*—Sheldon & Mak

[57] ABSTRACT

A wall panel mounting speaker unit and bracket therefor, the bracket including a pair of beams for bridging a blind opening of the panel, the beams being connected by screws to a housing of the speaker unit for clamping the panel against a bezel flange of the speaker unit. A pair of foot members are tiltably attached to each beam, the foot members making level contact with the panel regardless of bending deflections of the beams due to clamping forces produced by the screws.

17 Claims, 2 Drawing Sheets

PANEL MOUNT SPEAKER SUPPORT SYSTEM

BACKGROUND

The present invention relates to panel or wall mounted speaker units, and more particularly to an improved system for mounting speaker units of intercoms and the like to a wall panel having a suitable opening formed therein.

Speaker units for intercoms and distributed sound systems are commonly mounted to gypsum wallboard panels and other wall members of building structures. In typical frame construction, an opening for receiving a body portion of the speaker unit is formed in the panel between supporting studs, the body portion projecting within a blind cavity bounded by the studs, the panel, and other wall paneling that is fastened to the studs opposite the panel having the opening. In the past, the speakers were often directly fastened to the panels by screw fasteners. However, gypsum wallboard provides a poor anchor for screw fasteners. Thus the mounting preferably involves clamping the panel between a bezel flange of the unit and movable members that contact hidden surfaces of the panels.

In one implementation, the clamping is effected by a plurality of swinging arms that are initially positioned within an outline of the body portion for permitting the speaker unit to be placed with the bezel flange contacting the panel, the arms being mounted on screw fasteners that are accessible from a front portion of the speaker unit. Initial rotation of each fastener causes the corresponding arm to be pivoted such that the arm extends behind the panel outside of the opining; continued rotation causes the arm to be drawn toward the bezel flange for clamping the panel between the arm and the flange.

In another implementation, clamping is effected by a pair of beam members that extend across the opening, the beam members being drawn against the back side of the panel by screw fasteners that are initially loosened sufficiently for permitting the beam members to be jockeyed into position behind the panel as the speaker unit is positioned with the bezel flange against the front of the panel. In this implementation, the screw fasteners connecting the beam members to the body of the speaker unit must be spaced a significant distance from at least one end of the body for permitting the speaker unit to be temporarily located with a portion of the panel extending between the body and the beam members, so that opposite ends of the beam members can be jockeyed behind the panel. Also, the beam members are typically formed having shallow cross-sectional shapes for permitting the speaker unit to be mounted as described above in walls having relatively close spacing between opposite panels thereof, and for facilitating low cost manufacture of the beam members. Consequently, the speaker units of the prior art having clamp beams as described herein are subject to significant flexural deformation of the beam members during installation, to the extent that panel-contacting ends of the beam members contact the panels only at boundaries of the opening. Unfortunately, the panels are subject to crumbling and ends of the beam members are subject to being displaced toward or into the opening when the clamping force is applied by the fasteners, even when additional fasteners are employed following preliminary tightening of the initial complement of fasteners connecting the beam members to the body.

In a recent development, one configuration of the clamping beams has been provided with sloping feet that initially contact the back side of the panel at extremities only of each beam, with the feet coming into full contact with the panel only at a predetermined bending deflection of the beams. Unfortunately, it is difficult or impossible to determine the contact orientation of the feet during installation of the speaker unit when the space behind the panel is not visible, being covered by the speaker unit. Thus the clamping is likely to involve edge-contact only by the feet against the panel, subjecting the panel to possible damage from excessive concentrations of force. Further, edge contact by the feet is unavoidable at clamping forces less than those producing the desired predetermined deflection of the beams, resulting in some damage to panels formed of many typical materials such as gypsum and low-density pressed fiberboard by edge contact with the feet. It is also possible that the backside of the panel is uneven such that edge or corner contact results even when a desired deflection is imparted to the beam.

Efforts directed to tightening the clamping fasteners to a predetermined torque for effecting the predetermined bending deflection are uncertain at best, in that the beams can be clamped using from two to six fasteners apiece, the shape of the beam deflection being markedly affected by the distribution of clamping forces along the beam. Moreover, the clamping forces generated by the various fasteners is only very roughly proportional to the applied torque, particularly in the usual case of the customary self-threading fasteners engaging molded plastic clamp beams.

Thus there is a need for speaker units having beam clamps for mounting to blind panels, the clamps making full contact with the panel regardless of bending deflections of the beams during and after installation of the speaker units.

SUMMARY

The present invention meets this need by providing a speaker unit having tiltable panel clamp feet. In one aspect of the invention a speaker support bracket for mounting the speaker unit includes a beam member for bridging the panel opening, a spaced pair of foot members connected to the beam member and having respective contact surfaces for contacting a rear panel surface on opposite sides of a panel opening, and at least one clamp engaging surface formed on the beam member and spaced between the foot members for clamping the panel member between the foot members and the speaker unit, the foot members being tiltable relative to the beam member in response to bending flexure of the beam member when clamping force is applied between the clamp engaging surface and the panel member. The bracket can include at least two of the clamp engaging surfaces that are spaced apart between the foot members. The foot members can have arcuate beam contacting surfaces that mate with corresponding bearing surfaces of the beam member, the foot members slidably contacting the beam member. The beam contacting and bearing surfaces can be cylindrical or, preferably, spherical for permitting alignment of the foot members with uneven panel surfaces.

In another aspect of the invention, a speaker unit for mounting to a panel having a panel opening includes a housing having a body portion and a projecting flange for placement against the panel, the flange enclosing the panel opening; a transducer on the body portion for producing sound in response to an external signal; a clamp member; a support bracket having a beam member for bridging the panel opening opposite the flange, a spaced pair of foot members tiltably connected to the beam member and having respective contact surfaces for contacting the panel on opposite sides of the panel opening, a clamp member engaging surface being formed on the beam member and spaced between the foot members for clamping the panel member between the foot members and the flange portion, the foot members being tiltable relative to the beam member in response to bending flexure of the beam member when clamping force is applied between the clamp engaging surface and the panel member.

DRAWINGS

These and other features, aspects, and advantages of the present invention will become better understood with reference to the following description, appended claims, and accompanying drawings, where:

DESCRIPTION

Figure 5:
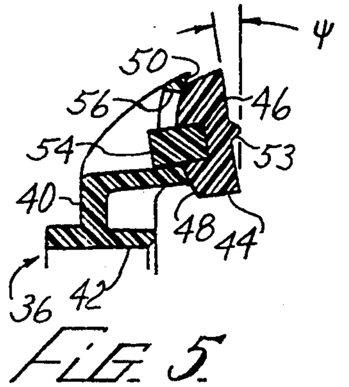
FIG. 5 is another detail view as in FIG. 2, the foot portion being tilted oppositely.

The present invention is directed to a wall mount speaker unit having beam clamps that are configured for facilitating effective clamping to a blind wall panel without undesirably damaging the panel. With reference to FIGS. 1–6 of the drawings, a speaker unit 10 according to the present invention includes a housing 12 having a body portion 14 and a flange portion 16, a low frequency speaker 18 and an high frequency speaker 20 being supported by the body portion 14 in a suitable manner, the manner and placement of the speakers 18 and 20 being outside the scope of the present invention. The speakers 18 and 20 are contemplated to be interconnected with a suitable crossover network (not shown) for operation with appropriate external electronic circuitry.

Figure 1:
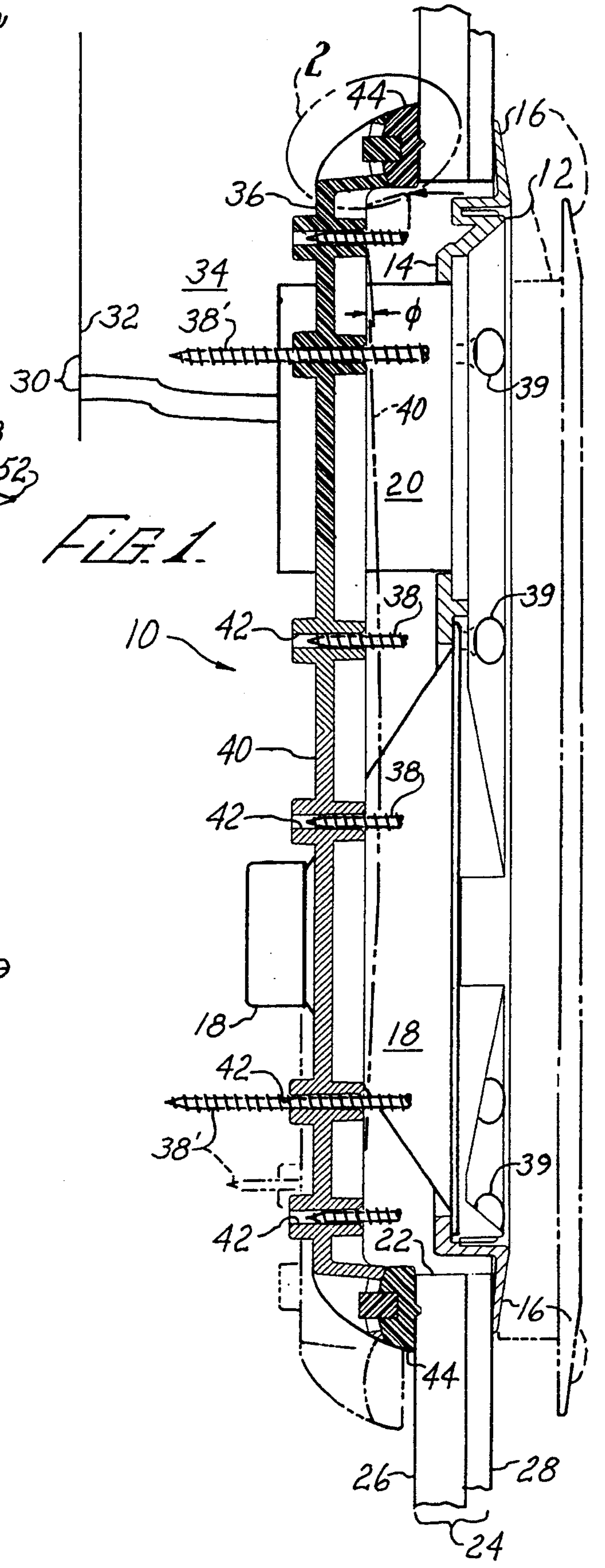
FIG. 1 is a fragmentary sectional elevational view of a speaker unit according to the present invention installed in a paneled wall structure.
Figure 6:
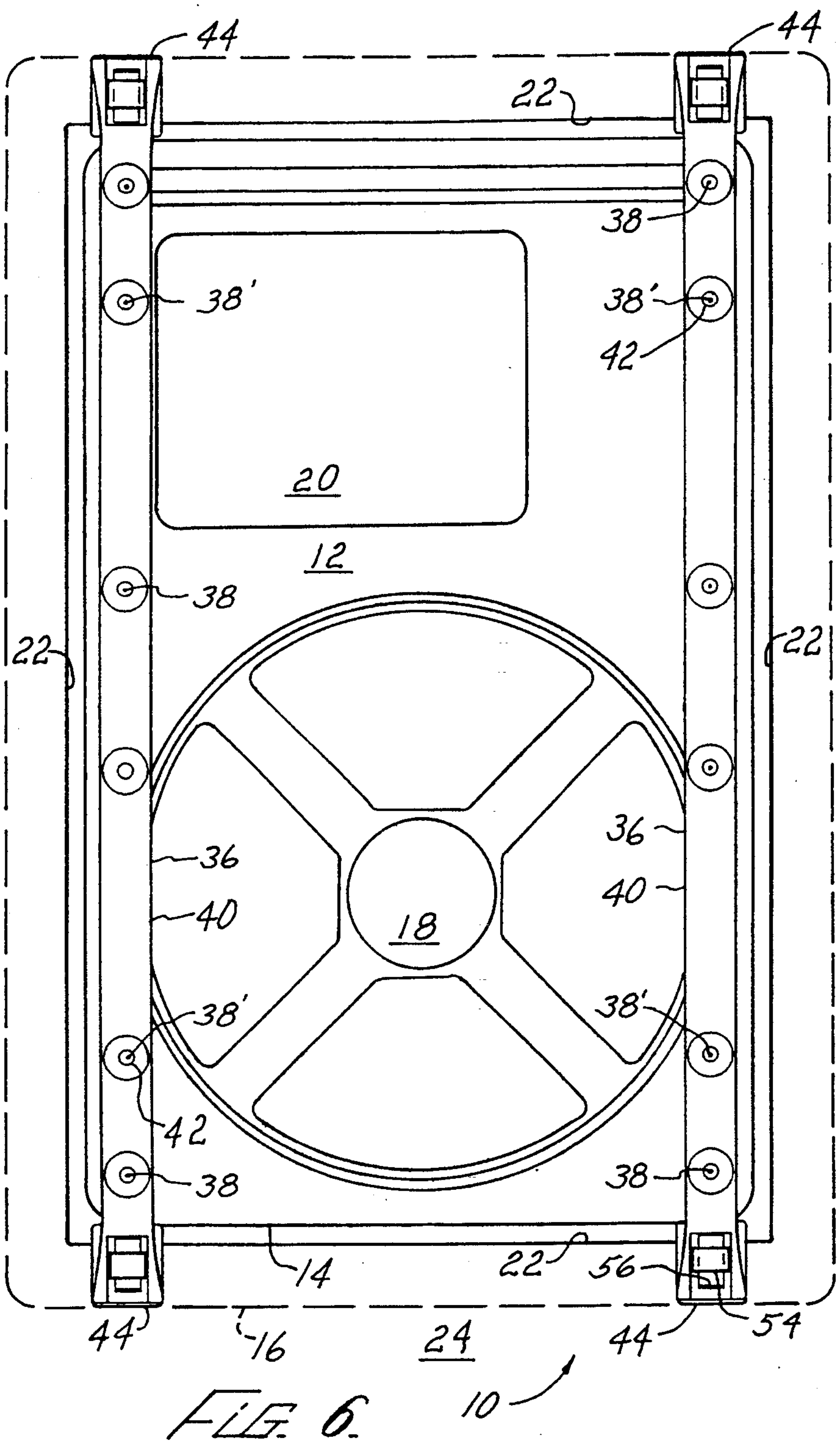
FIG. 6 is a rear elevational view of the speaker unit of FIG. 1.

As shown in FIGS. 1 and 6, the body portion 14 of the housing 12 extends through an opening 22 that is formed in a wall panel 24, the panel 24 being either a single member or having a main portion 26 and a covering 28 as shown in FIG. 1. The panel 24 is supported on parallel-spaced studs 30 or other members of a building structure, the studs 30 forming an interior frame of the structure between the panel 24 and a wall member 32, a blind cavity 34 being formed behind the speaker unit 10. The speaker unit 10 also includes a pair of brackets or beam assemblies 36 that are each connected to the housing 12 by a plurality of screw fasteners 38, the beam assemblies bridging the panel opening 22 for clamping the panel 24 between the flange portion 16 and the beam assemblies 36. Each of the beam assemblies 36 includes a beam member 40 having a spaced plurality of openings 42 formed therein for threadingly engaging respective ones of the fasteners 38, the openings 42 serving as clamp-engaging surfaces of the beam member 40. The housing 12 also has a plurality of clearance holes 39 formed therein for receiving the fasteners 38. At least some of the fasteners, designated 38', are sufficiently long that the beam assemblies 36 can be spaced apart from the body portion 14 of the housing 12 as required for jockeying the speaker unit 10 into the panel opening 22 while locating the flange portion 16 against the panel 24, the fasteners 38' closest to one end of the beam assemblies 36 also being spaced sufficiently within the body portion 14 for permitting opposite ends of the beam assemblies 36 to be manipulated through the panel opening 22. Once an initial clamping by the fasteners 38' is achieved, others of the fasteners 38 are used as may be desired for completing clamping. It will be understood that the other fasteners 38 need not be as long as the fasteners 38'. Also, the fasteners 38 can be of the self-threading type as shown in the drawings or the openings 40 can be formed threaded prior to assembly with the fasteners 38. Typically, three of the fasteners 38 are used for each of the beam assemblies 36.

According to the present invention, each beam assembly 36 includes a pair of foot members 44 that are tiltably connected at opposite ends of the beam member 40 for providing level contact with the panel 24 regardless of deflection of the beam member 40 such as resulting from clamping force applied by the fasteners 38.

Figure 2:
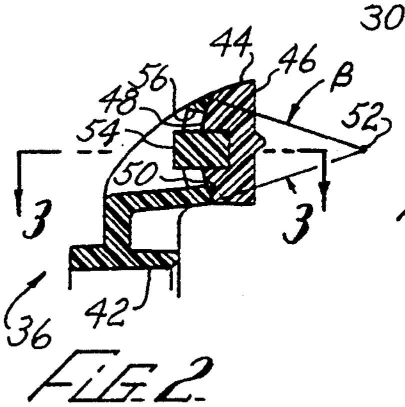
FIG. 2 is a sectional detail view of a clamp foot portion of the speaker unit of FIG. 1 within region 2 thereof.
Figure 3:
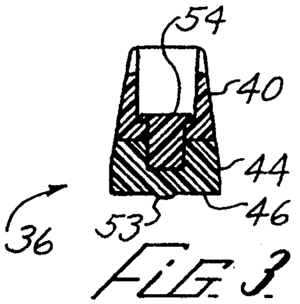
FIG. 3 is a plan sectional detail view of the foot portion of FIG. 2 on line 3—3-therein.

As most clearly shown in FIGS. 2 and 3, each foot member 44 is formed with a generally planar base surface 46 and a circularly curved beam contacting surface 48 for slidably engaging a complementary bearing surface 50 of the beam member 40, each of the foot members moving about a pivot axis 52 relative to the beam member 40. Each of the foot members 44 can be formed with a small cleat portion 53 projecting from the base surface 46. The cleat portion 53 typically projects slightly into the panel 24 during the clamping for enhanced positional stability of the speaker unit 10 on the panel 24.

Preferably the beam assemblies 36 are configured for locating the foot members 44 directly opposite a bezel region that is defined on the panel 24 substantially within outer extremities of the flange portion 16 of the housing 12. Thus the panel 24 is loaded primarily in compression by the clamping. Also, installation of the speaker unit 10 is facilitated by reducing the shifting of the housing 12 that would otherwise be required for permitting passage of the beam assemblies 36 through the panel opening 22.

It is further preferred that the beam assemblies 36 have a smoothly curved end profile from the base surfaces 46 of the foot members 44 to rear portions of the beam members 40 for facilitating smooth passage of the beam assemblies 36 through the panel opening 22. Moreover, it is desired that there be a relatively large area of contact between the beam contacting surfaces 48 and the respective bearing surfaces 50 of the beam members for limiting compressive stresses in the mating parts. Accordingly, the beam contacting surfaces 48 are preferably convex, terminating proximate the base surface 46. The pivot axes 52 are also advantageously located opposite the base surfaces 46 from the beam member 40, thereby stabilizing the foot members 44 against rocking in case the cleat portions 53 do not fully project into the panel 24. Moreover, the beam contacting surfaces 48 and the bearing surfaces 50 contact within a subtended contact angle β that is less than 180° for efficient load-carrying capacity of the foot members 44 in a compact configuration of the beam assemblies 36, in that the clamping load is distributed substantially uniformly over the contacting portions of the surfaces 48 and 50.

Figure 4:
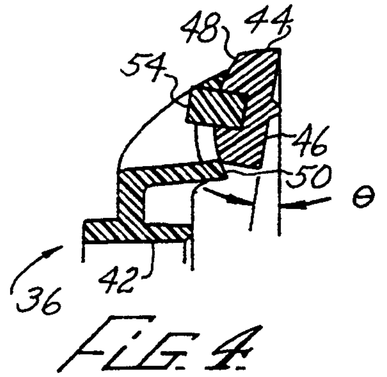
FIG. 4 is a detail view as in FIG. 2, showing the foot portion tilted in one direction.

The foot members 44 are movably retained on the beam members 36 by respective headed peg members 54 that extend through corresponding slots 56 of the beam member 36 within the bearing surfaces 50, each peg member 54 having fixed engagement with the associated foot member 44, preferably by means of a press fit and bonding. Suitable materials for forming the beam members 36, the foot members, and the peg members, is an ABS plastic polymer, the bonding being effected by methyl-ethyl ketone (MEK) solvent. Each foot member 44 is tiltable inwardly a deflection angle φ from a neutral position relative to the beam member 40 as shown in FIG. 3 and by the solid lines of FIG. 1 wherein the contacting surfaces 48 are aligned with no bending deflection of the beam member 36 to positions exemplified by dashed lines in FIG. 1 wherein the contacting surfaces 48 are aligned with the beam member deflected in bending by loading from the fasteners 48. FIG. 4 shows the foot member 44 of FIG. 2 tilted to a maximum tilt angle θ that is normally greater than the deflection angle φ for permitting level contact between the base surface 46 and the panel 24 when the contacted portions of the panel 24 are not in flat alignment. In an exemplary and preferred configuration of the speaker unit 10, the maximum tilt angle θ is approximately 10° as shown in FIG. 4, a less preferred maximum tilt angle θ being approximately 5°.

Similarly, FIG. 5 shows the foot member 44 of FIG. 2 tilted outwardly to a minimum tilt angle ψ opposite the maximum tilt angle θ for permitting level contact between the base surface 46 and the panel 24 when the contacted portions of the panel 24 are misaligned such that outward tilting of one or more of the foot members 44 is dictated. In the exemplary and preferred configuration of the speaker unit 10 depicted in the drawings, the minimum tilt angle ψ is 10°, a slightly less preferred minimum tilt angle ψ being approximately 5°. Assuming a symmetric distribution of expected surface irregularity or misalignment of the contacted portions of the panel 24, a preferred range of the tilt angle between θ and ψ is symmetric about the expected deflection angle φ, that being in the range of from approximately 2° to approximately 7° for the beam member 40 configured as shown in the drawings.

The beam contacting surface 46 and the bearing surface 50 are preferably circularly cylindrical and oriented such that the pivot axes 52 are perpendicular to the beam members 40 and parallel to the respective base surfaces 46 for enhancing lateral stability of the beam assemblies 36.

Figure 7:
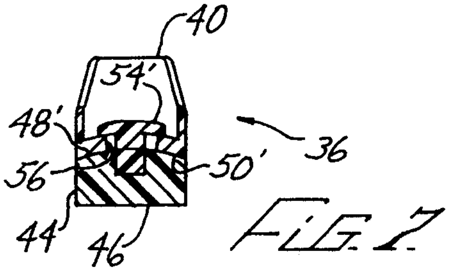
FIG. 7 is a plan detail view as in FIG. 3 showing an alternative configuration of the foot of FIG. 2.

With further reference to FIG. 7, an alternative configuration of the beam assembly 36 has a counterpart of the beam contacting surface of the foot member 44, designated 48', and a counterpart of the bearing surface of the beam member 40, designated 50', spherically formed for permitting the base surface 46 of the foot member 44 to compensate for lateral as well as longitudinal surface irregularities of the wall panel 24. As further shown in FIG. 7, a counterpart of the peg member, designated 54', is spherically headed, and the slot 56 is enlarged laterally for accommodating lateral movement of the peg member 54' within the beam member 40.

Figure 8:
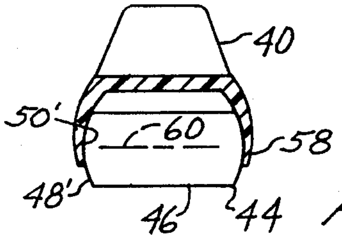
FIG. 8 is a plan detail view as in FIG. 3 showing another alternative configuration of the foot of FIG. 2.

With further reference to FIG. 8, another alternative configuration of the beam assembly 36 provides retention of the foot member 44 on the beam member 40 by having the spherical beam contacting surface 48' of the foot member 44 extending beyond an 180° included angle, the spherical bearing surface 50' of the beam member 40 extending within a retainer portion 58 of the beam member 40 and contacting a portion of beam contacting surface 48 opposite an equator 60 of the beam contacting surface 48 from a main load-carrying portion thereof. Assembly of the foot member 44 into the beam member 40 is effected by slight deflection (stretching) of the retainer portion 58.

Although the present invention has been described in considerable detail with reference to certain preferred versions thereof, other versions are possible. For example, the beam assemblies 36 can be interconnected for further enhanced lateral stability. Further, the foot members 44 can be provided with laterally oriented cleats at opposite ends of the base surfaces 46, in place of the cleat portion 53. Moreover, the beam members 40 and/or the body portion 14 of the housing 12 can be formed for limiting the maximum deflection of the beam members by appropriate boss configurations at locations of the fasteners 38. The boss configurations can provide for contact between the beam members 40 and the housing 12 at a maximum safe deflection of the beam members 40 when the speaker unit 10 is installed on a thin (¼ or ½ inch) panel 24, with spacers being provided for use on the fasteners 38 when the panel 24 is thicker. In the configuration of FIG. 8, the retainer portion 58 can be formed separately from the beam member 40, being affixed thereto by a suitable adhesive following assembly of the foot member 44. Therefore, the spirit and scope of the appended claims should not necessarily be limited to the description of the preferred versions contained herein.

What is claimed is:

1. A speaker support bracket for mounting a speaker unit to a panel member, the panel member having a panel opening therein, the panel opening being spaced within a footprint region of the panel, the footprint region corresponding to a bezel contact outline of the speaker unit, the bracket comprising:

(a) a beam member for bridging the panel opening opposite the footprint region;

(b) a pair of foot members movably connected to the beam member at spaced apart locations thereon and having respective panel contact surfaces for contacting a rear surface of the panel member on opposite sides of the panel opening, the foot members being tiltable relative to the beam member wherein each of the foot members has an arcuate beam contacting surface formed thereon, the beam member having corresponding arcuate bearing surfaces formed thereon for slidably contacting the respective beam contacting surfaces; and (c) at least one clamp engaging surface formed on the beam member and spaced between the foot members for clamping the panel member between the foot members and the speaker unit, the foot members being tiltable relative to the beam member in response to bending flexure of the beam member when clamping force is applied between the clamp engaging surface and the panel member.

2. The bracket of claim 1, including at least two of the clamp engaging surfaces, the clamp engaging surfaces being spaced apart between the foot members.

3. The bracket of claim 1, wherein contacting portions of each bearing surface and the corresponding beam contacting surfaces subtend respective bearing angles, the bearing angles of each being less than 180°, the bracket further comprising a pair of retainers for holding the foot members engaged with the beam member.

4. The bracket of claim 3, wherein the beam member is formed with slots therein within each of the bearing surfaces, each of the retainers comprising a headed member rigidly connected to the respective foot member and engaging the corresponding slot.

5. The bracket of claim 1, wherein each of the foot members is pivotable on a pivot axis relative to the beam member, the contact surface of each foot member being located between the pivot axis and the corresponding bearing surface of the beam member for facilitating alignment of the foot members with the panel.

6. The bracket of claim 5, wherein each of the foot members is pivotable through a deflection angle $\phi$ from a starting position, wherein the panel contact surfaces are aligned when no clamping force is applied to the beam to a clamped position and the panel contact surfaces are aligned when the beam is subjected to the clamping force, the beam deflecting to a tilting angle $\theta$, the tilting angle $\theta$ being not less than approximately 5° for permitting level contact at each foot member with the panel.

7. The bracket of claim 6, wherein each of the foot members is oppositely pivotable from the starting position to a tilting angle $\psi$ opposite the angle $\theta$, the angle $\psi$ being not less than approximately 5° for permitting level contact of each foot member with the panel having an uneven surface.

8. The bracket of claim 1, wherein the beam contacting surfaces and the bearing surfaces are cylindrical.

9. The bracket of claim 1, wherein the beam contacting surfaces and the bearing surfaces are spherical.

10. The bracket of claim 1, for mounting the speaker unit to an architectural structure, the architectural structure including the panel member and a supporting interior frame, the bezel region extending a flange distance on opposite sides of a body portion of the speaker unit, the body portion extending within the panel opening and having a fastener clearance hole formed therethrough, the clamp engaging surface being threadingly engagable by a screw fastener extending through the clearance hole for clamping the panel member between the bracket and the speaker unit, the screw fastener having sufficient length for connecting the body portion spaced apart from the bracket, the bracket with the body portion connected thereto being insertable through the panel opening prior to the clamping.

11. A speaker unit for mounting to a panel member having a panel opening therein, comprising:

(a) a housing having a body portion and a flange portion extending from the body portion for placement against the panel member, the flange portion enclosing the panel opening;

(b) a transducer on the body portion for producing sound in response to an external signal;

(c) at least one clamp member;

(d) a support bracket comprising:

(i) a beam member for bridging the panel opening opposite the flange portion;

(ii) a pair of foot members movably connected to the beam member at spaced apart locations thereon and having respective contact surfaces for contacting the panel member on opposite sides of the panel opening, the foot members being tiltable relative to the beam member wherein each of the foot members has an arcuate beam contacting surface formed thereon, the beam member having corresponding arcuate bearing surfaces formed thereon for slidably contacting the respective beam contacting surfaces;

(iii) at least one clamp member engaging surface formed on the beam member and spaced between the foot members for engagement by the clamp member, the clamp member clamping the panel member between the foot members and the flange portion, the foot members being tiltable relative to the beam member in response to bending flexure of the beam member when clamping force is applied between the clamp engaging surface and the panel member.

12. The speaker unit of claim 11, wherein the beam member is formed with a plurality of the clamp member engaging surfaces spaced apart between the foot members, the speaker unit comprising a plurality of the clamp members for clamping the panel member between the foot members and the flange portion.

13. The speaker unit of claim 12, wherein the clamp members are screw fasteners, the beam member having clamp member engaging surfaces for engagement by each of the fasteners.

14. The speaker unit of claim 13, wherein the panel member is attached to an interior frame of an architectural structure, and wherein the body portion extends within the panel opening, having a plurality of fastener clearance holes formed therethrough, the clamp member engaging surfaces being threadingly engagable by respective ones of the screw fasteners extending through the clearance holes for clamping the panel member between the bracket and the speaker unit, the screw fasteners having sufficient length for connecting the body portion spaced apart from the bracket, the bracket with the body portion connected thereto being movable through the panel opening prior to the clamping.

15. The speaker unit of claim 11, wherein contacting portions of each bearing surface and the corresponding beam contacting surface subtends a bearing angle, the bearing angles each being less than 180°, the bracket further comprising a pair of retainers for holding the foot members engaged with the beam member.

16. The speaker unit of claim 11, comprising a parallel spaced pair of the support brackets.

17. A speaker support bracket for mounting a speaker unit to a panel member, the panel member having a panel opening therein, the panel opening being spaced within a footprint region of the panel, the footprint region corresponding to a bezel contact outline of the speaker unit, the bracket comprising:

(a) a beam member for bridging the panel opening opposite the footprint region and having spaced apart concave arcuately cylindrical bearing surfaces formed thereon, the beam member also having a slot formed therethrough from each of the bearing surfaces;

(b) a pair of foot members movably connected to the beam member and having respective contact surfaces for contacting a rear surface of the panel member on opposite sides of the panel opening, each foot member having a convex arcuately cylindrical beam contacting surface formed thereon for slidably engaging a respective bearing surface of the beam member;

(c) a headed peg member rigidly projecting from each beam contacting surface and through a corresponding one of the slots for retaining the foot members on the beam member; and (d) at least one clamp engaging surface formed on the beam member and spaced between the foot members for clamping the panel member between the foot members and the speaker unit, the foot members being inwardly tiltable at least 5° relative to the beam member in response to bending flexure of the beam member when clamping force is applied between the clamp engaging surface and the panel member.

* * * * *